United States Patent [19]
Lee

[11] Patent Number: 6,117,789
[45] Date of Patent: Sep. 12, 2000

[54] METHOD OF MANUFACTURING THIN FILM RESISTOR LAYER

[75] Inventor: Jia-Sheng Lee, Hsinchu, Taiwan

[73] Assignee: United Microelectronics Corp., Hsinchu, Taiwan

[21] Appl. No.: 09/285,315

[22] Filed: Apr. 2, 1999

[51] Int. Cl.[7] .................... H01L 21/302; H01L 21/3065
[52] U.S. Cl. .................... 438/706; 710/720; 257/389
[58] Field of Search ................... 438/706, 710, 438/720

[56] References Cited

U.S. PATENT DOCUMENTS

| | | | |
|---|---|---|---|
| 5,420,063 | 5/1995 | Maghsoudnai et al. | 438/384 |
| 5,605,859 | 2/1997 | Lee | 438/384 |
| 5,656,524 | 8/1997 | Eklund et al. | 438/238 |

*Primary Examiner*—Benjamin L. Utech
*Assistant Examiner*—Lynette T. Umez-Eronini
*Attorney, Agent, or Firm*—Thomas, Kayden, Horstemeyer & Risley

[57] ABSTRACT

A method of manufacturing a thin film resistor layer. A first insulating layer is formed on a substrate, wherein the substrate has at least a device previously formed therein. A thin film resistor layer is formed on the first insulating layer. A second insulating layer is formed on the thin film resistor layer. The second insulating layer and the thin film resistor layer are patterned. A third insulating layer is formed on the first insulating layer and the patterned second insulating layer. An anisotropic etching step is performed to form a first opening penetrating through the third and the first insulating layers and to form a second and a third openings penetrating through the third insulating layer, simultaneously. A self-aligned etching step is performed to expose a portion of the thin film resistor layer through the second and the third openings. The second and the third openings are filled with a conductive material to form interconnects on the third insulating layer.

11 Claims, 2 Drawing Sheets

METHOD OF MANUFACTURING THIN FILM RESISTOR LAYER

BACKGROUND OF THE INVENTION

1. Field of the Invention

The present invention relates to a method of manufacturing a semiconductor device. More particularly, the present invention relates to a method of manufacturing a thin film resistor layer.

2. Description of the Related Art

The resistor is one of the most common electrical components and is widely used in almost every electrical device. A semiconductor device, mostly an integrated circuit, including memories and logical devices, normally consists of resistors and other electrical components. The resistance provided by a resistor is proportional to the length of the resistor and the reciprocal of the cross-sectional area of the resistor; both are measured in the direction of the current. That is, the resistance of a resistor fulfills the following equation:

$$R = \rho \frac{L}{A},$$

wherein $\rho$ is the resistivity of the resistor, L and A are the length and the cross-sectional area of the resistor, respectively, and wherein both L and A are measured in the direction of the current.

Conventionally, doped polysilicon is used as the material of a resistor in a semiconductor fabrication process, wherein the resistance is controlled by predetermined L and A of the doped polysilicon layer.

As the integration of a semiconductor device is increased, all components within a semiconductor integrated circuit have to provide equivalent or better electrical properties. Hence, a downsized resistor still has to provide a required resistance. However, a conventional resistor made of doped polysilicon can only provide a limited resistance within a limited space because of the property of polysilicon. Using a polysilicon resistor to provide a relatively high resistance then becomes a problem in designing and fabricating a highly integrated semiconductor device.

For overcoming the foregoing problem, new materials like CrSi having a higher resistivity than that of polysilicon are applied in the fabrication of a thin-film resistor of a highly integrated semiconductor device.

However, when the CrSi is immediately exposed in the plasma process, the chemistry of the CrSi is destroyed. Therefor, in the process for patterning a CrSi layer, an aluminum layer or an aluminum alloy layer is used as a protective layer to protect the CrSi layer from the damages caused by the plasma. Since titanium reacts with aluminum in a subsequent inter-metal connects process, it is impossible to use a titanium layer as a barrier layer. Incidentally, the sidewall of the patterned CrSi layer is not protected by the protective layer. In a subsequent inter-metal connects process, the sidewall of the CrSi layer uncovered by the protective layer is electrically coupled to the wire formed above the CrSi layer, which is caused by process inaccuracy, so that the directions of current flow are increased and the resistance of the CrSi layer changes. Hence, the electrical operation of the devices changes.

SUMMARY OF THE INVENTION

The invention provides a method of manufacturing a thin film resistor layer. By using the invention, the efficiency of electrical operation of the devices can be maintained and the cost is reduced.

To achieve these and other advantages and in accordance with the purpose of the invention, as embodied and broadly described herein, the invention provides a method of manufacturing a thin film resistor layer. A first insulating layer is formed on a substrate, wherein the substrate has at least a device previously formed therein. A thin film resistor layer is formed on the first insulating layer. A second insulating layer is formed on the thin film resistor layer. The second insulating layer and the thin film resistor layer are patterned. A third insulating layer is formed on the first insulating layer and the patterned second insulating layer. An anisotropic etching step is performed to form a first opening penetrating through the third and the first insulating layers and to form a second and a third openings penetrating through the third insulating layer, simultaneously, wherein the first opening expose the device in the substrate and the second and the third openings exposes a portion of the patterned second insulating layer above the thin film resistor layer. A self-aligned etching step is performed to expose a portion of the thin film resistor layer through the second and the third openings. A conductive material fills the first, the second and the third openings to form interconnects on the third insulating layer. Since the top surface and the sidewall of the patterned thin film resistor layer are respectively covered by the patterned second insulating layer and the third insulating layer, plasma damage to the patterned thin film resistor layer and the problem caused by the process inaccuracy and the conductive residue can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
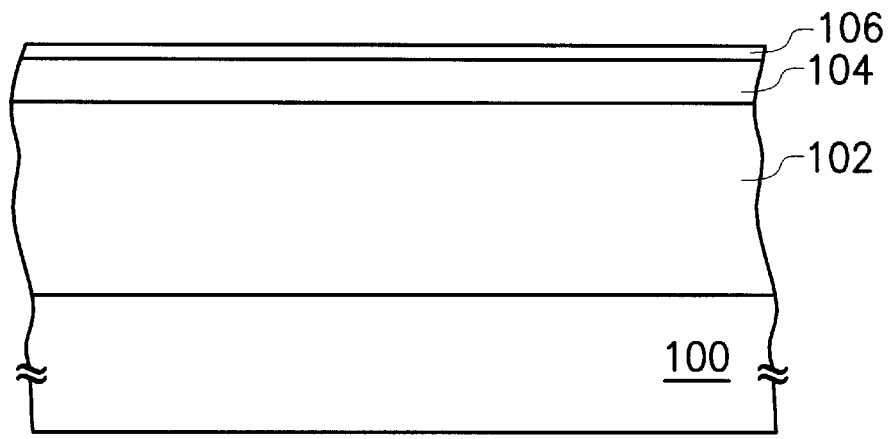
FIGS. 1A through 1E are schematic, cross-sectional views of the process for manufacturing an inter-metal connect in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views of the process for manufacturing an inter-metal connect in a preferred embodiment according to the invention.

As shown in FIG. 1A, a substrate 100 having devices (not shown) previously formed therein is provided. An insulating layer 102 is formed on the substrate 100. The material of the insulating layer 102 includes borophosphosilicate glass (BPSG) or silicon oxide, for example. A thin film resistor layer 104 is formed on the insulating layer 102. The thin film resistor layer 104 can be formed from $Cr_xSi_y$ by sputtering at about 250–350° C., for example. An insulating layer 106 is formed on the thin film resistor layer 104. The insulating layer 106 can be formed from silicon nitride by chemical vapor deposition, for example, and the thickness of the insulating layer 106 is about 1000–3000 angstroms. The insulating layer 106 is used as a protective layer to protect the thin film resistor layer 104 from plasma damage. The material of the insulating layer 106 is different from that of the insulating layer 102.

Figure 1B:
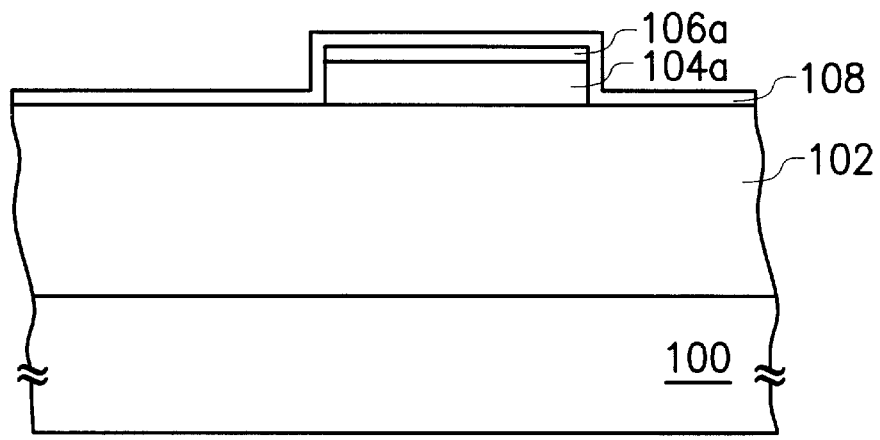

As shown in FIG. 1B, the insulating layer 106 and the thin film resistor 104 are patterned to expose a portion of the insulating layer 102. The method of patterning the insulating layer 106 and the thin film resistor 104 includes dry etching, for example. The remaining insulating layer 106 and the thin film resistor 104 are respectively denoted as insulating layer 106a and thin film resistor 104a. An insulating layer 108 is conformally formed on the insulating layer 102 and the insulating layer 106a. The insulating layer 108 is used to protect the sidewall of the thin film resistor 104a and is used as a mask for etching the insulating layer 106a in a subsequent process. The material of the insulating layer 108 is different from that of the insulating layer 106a. The insulating layer 108 can be a silicon oxide layer and the thickness of the insulating layer 108 is about 1000–3000 angstroms, for example.

Figure 1C:
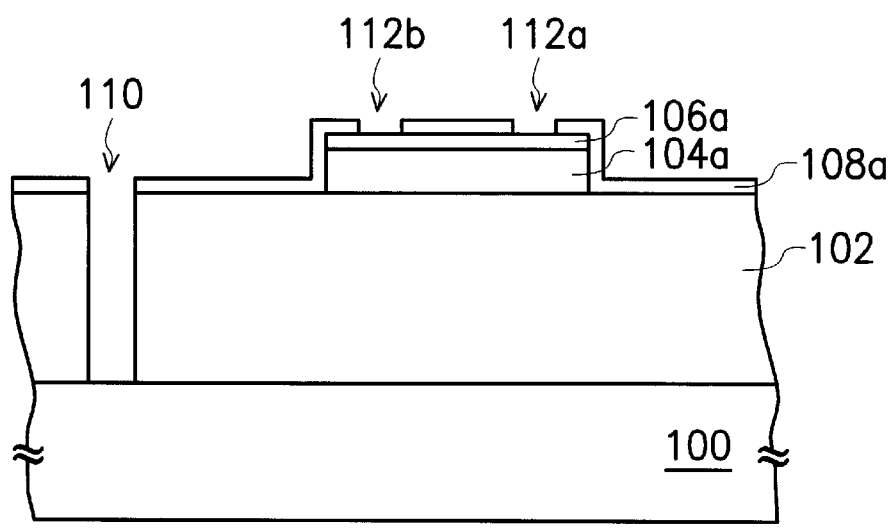

As shown in FIG. 1C, an opening 110 is formed to penetrate through the insulating layers 108 and 102 and expose the device (not shown) in the substrate 100. Simultaneously, openings 112a and 112b are formed to penetrate through the insulating layer 108 and expose a portion of the insulating layer 106a above the thin film resistor layer 104a. The opening 110 can be a node contact hole or a via hole. The method of forming the openings 110, 112a and 112b can be anisotropic etching, for example. Preferably, the method of forming the opening 110 is plasma etching, for example. The insulating layers 108 and 102 penetrated through by the openings 110, 112a and 112b are respectively denoted as insulating layers 108a and 102a.

Figure 1D:
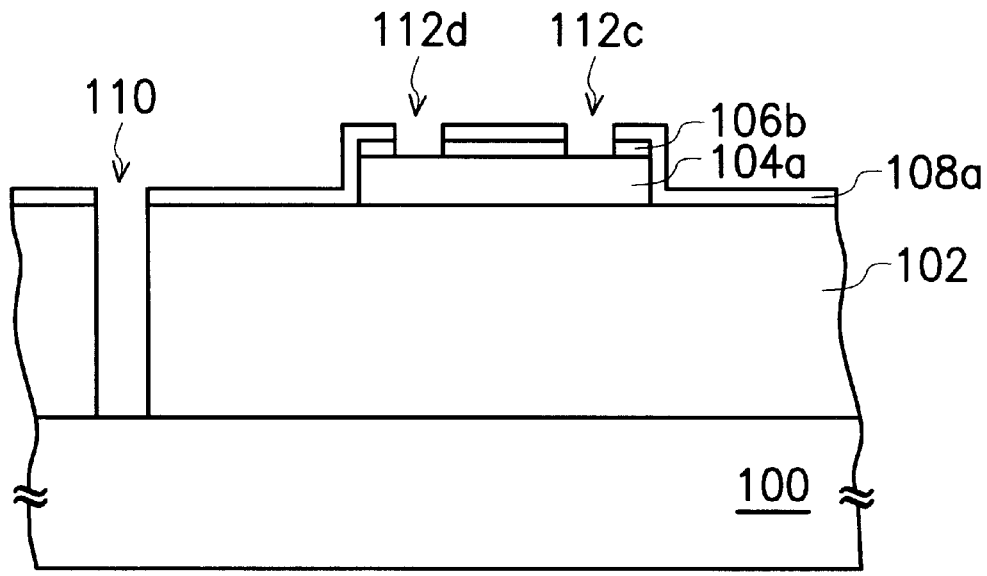

As shown in FIG. 1D, a self-aligned etching step is performed to remove a portion of the insulating layer 106a exposed by the openings 112a and 112b until a portion of the thin film resistor 104a is exposed by the openings 112a and 112b. The openings 112a and 112b penetrating through the insulating layers 108a and 106b are respectively denoted as openings 112c and 112d. The insulating layer 106a penetrated through by the openings 112c and 112d is denoted as insulating layer 106b. The self-aligned etching step can be wet etching, for example. In this example, when the material of insulating layer 106a is silicon nitride, the insulating layer 106a is etched by wet etching with hot phosphoric acid ($H_3PO_4$). Since the openings 112c and 112d are formed by wet etching, plasma damage to a portion of the thin film resistor layer 104a exposed by the openings 112c and 112d can be avoided. In the self-aligned etching step, the insulating layer 108a is used as an etching mask, so that it is unnecessary to use another photomask in the etching step.

In the invention, a node contact hole or a via hole and a region used to electrically couple to the thin film resistor layer are respectively formed by only one photomask in two stages.

Figure 1E:
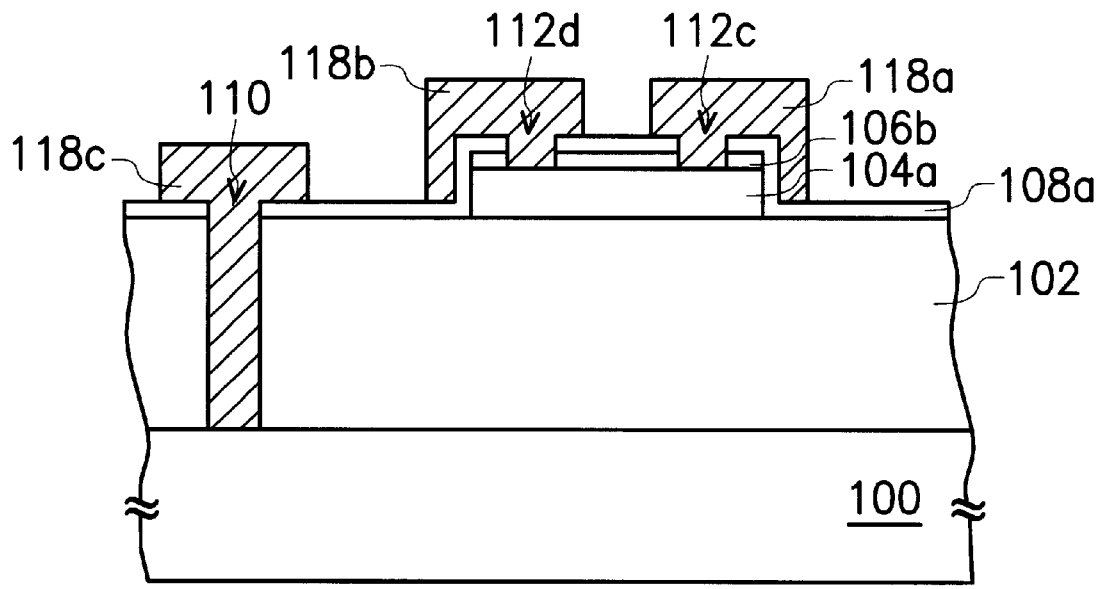

As shown in FIG. 1E, a conductive layer (not shown) is formed over the substrate 100 and fills the openings 110, 112c and 112d. The conductive layer is patterned to form wires 118a and 118b and a plug 118c. The wires 118a and 118b electrically couple to the thin film resistor layer 104a through the openings 112c and 112d, respectively. The wire 118a is electrically coupled to the wire 118b through the thin film resistor layer 104a. The plug 118c electrically couples to the device (not shown) in the substrate 100 through the opening 110. The plug 118c can be a node contact hole or a via plug, for example. Typically, the wires 118a and 118b are formed on the sidewall of the thin film resistor layer 104a when process inaccuracy occurs or a conductive residue remains on the sidewall of the thin film resistor layer 104a, so that the directions of current flow are increased and the resistance of the CrSi layer changes. Since the sidewall of the thin film resistor layer 104a is protected by the insulating layer 108a, the electrical quality of the thin film resistor layer 104a cannot be affected by the problem mentioned above.

The present invention includes the following advantages:

1. In the invention, the thin film resistor layer is protected by the insulating layer 106a while the thin film resistor layer is patterned by anisotropic etching, so that plasma damage to the thin film resistor layer can be avoided.
2. In the invention, since the sidewall of the thin film resistor layer is protected by the insulating layer 108a, the sidewall of the thin film resistor layer cannot be electrically coupled by the wires and the conductive residual. Hence, the efficiency of electrical operation of the devices can be maintained.
3. In the invention, the insulating layer 108a is used as an etching mask while a region used to electrically couple to the thin film resistor layer is formed by the self-aligned etching step. Moreover, the region used to electrically couple to the thin film resistor layer is formed by wet etching, so that plasma damage to the thin film resistor layer can be avoided.
4. In the invention, because the plug and the wires are formed simultaneously, the cost can be decreased.

The present invention and the conventional process techniques are compatible; thus the present invention is suitable for the manufacturers to utilize.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a thin film resistor layer, comprising steps of:

forming a first insulating layer on a substrate, wherein the substrate has at least a device previously formed therein;

forming a thin film resistor layer on the first insulating layer;

forming a second insulating layer on the thin film resistor layer;

patterning the second insulating layer and the thin film resistor layer;

forming a third insulating layer on the first insulating layer and the patterned second insulating layer;

performing an anisotropic etching step to form a first opening penetrating through the third and the first insulating layers and to form a second and a third openings penetrating through the third insulating layer, simultaneously, wherein the first opening exposes the device in the substrate and the second and the third openings expose a portion of the patterned second insulating layer above the thin film resistor layer;

performing a self-aligned etching step to expose a portion of the thin film resistor layer through the second and the third openings; and filling the first, the second and the third openings with a conductive material to form interconnects on the third insulating layer.

2. The method of claim 1, wherein materials of the first, the second and the third insulating layers respectively include borophosphosilicate glass, silicon nitride and silicon oxide.

3. The method of claim 2, wherein a thickness of the second insulating layer is about 1000–3000 angstroms and a thickness of the third insulating layer is about 1000–3000 angstroms.

4. The method of claim 3, wherein a material of the thin film resistor layer includes CrSi.

5. The method of claim 4, wherein the step of forming the thin film resistor layer includes sputtering.

6. The method of claim 5, wherein the sputtering is performed at 250–350° C.

7. The method of claim 1, wherein a material of the thin film resistor layer includes CrSi.

8. The method of claim 7, wherein the step of forming the thin film resistor layer includes sputtering.

9. The method of claim 8, wherein the sputtering is performed at 250–350° C.

10. The method of claim 1, wherein the step of patterning the second insulating layer and the thin film resistor layer includes dry etching.

11. The method of claim 1, wherein the anisotropic etching step includes a plasma etching step.

* * * * *